United States Patent
Miura et al.

(10) Patent No.: US 12,525,957 B2
(45) Date of Patent: Jan. 13, 2026

(54) RADIO-FREQUENCY MODULE AND COMMUNICATION DEVICE

(71) Applicant: Murata Manufacturing Co., Ltd., Nagaokakyo (JP)

(72) Inventors: Masanari Miura, Nagaokakyo (JP); Naru Morito, Nagaokakyo (JP); Masanori Kato, Nagaokakyo (JP); Syunsuke Kido, Nagaokakyo (JP); Tomomi Yasuda, Nagaokakyo (JP); Takanori Uejima, Nagaokakyo (JP); Takuma Kuroyanagi, Nagaokakyo (JP); Yukiya Yamaguchi, Nagaokakyo (JP); Yuuki Fukuda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 304 days.

(21) Appl. No.: 18/477,705

(22) Filed: Sep. 29, 2023

(65) Prior Publication Data
US 2024/0030894 A1    Jan. 25, 2024

Related U.S. Application Data

(63) Continuation of application No. PCT/JP2022/010793, filed on Mar. 11, 2022.

(30) Foreign Application Priority Data

Mar. 31, 2021    (JP) .................. 2021-059145

(51) Int. Cl.
| | |
|---|---|
| H03H 9/54 | (2006.01) |
| H03F 1/56 | (2006.01) |
| H03F 3/24 | (2006.01) |

(52) U.S. Cl.
CPC .............. H03H 9/542 (2013.01); H03F 1/56 (2013.01); H03F 3/245 (2013.01);
(Continued)

(58) Field of Classification Search
CPC .... H03H 9/542; H03H 7/1766; H03H 9/0542; H03H 9/0552; H03H 9/605;
(Continued)

(56) References Cited

U.S. PATENT DOCUMENTS

| | | | |
|---|---|---|---|
| 2004/0018814 A1 | 1/2004 | Lin et al. | |
| 2016/0112072 A1* | 4/2016 | Bauder ................. | H04B 1/005 370/297 |

(Continued)

FOREIGN PATENT DOCUMENTS

| | | |
|---|---|---|
| JP | 2006-311305 A | 11/2006 |
| JP | 2020-014204 A | 1/2020 |

(Continued)

OTHER PUBLICATIONS

International Search Report and Written Opinion mailed on May 24, 2022, received for PCT Application PCT/JP2022/010793, filed on Mar. 11, 2022, 10 pages including English Translation.

*Primary Examiner* — Ping Y Hsieh
(74) *Attorney, Agent, or Firm* — XSENSUS LLP

(57) ABSTRACT

A radio-frequency module includes a hybrid filter for 5th Generation New Radio (5G-NR) n77, a filter for 5G-NR n79, power amplifiers, a third inductor coupled to the power amplifier, and a fourth inductor coupled to a power amplifier. When a module substrate is viewed in plan view, the power amplifiers are disposed in a first quadrant, the third inductor and the fourth inductor are disposed in a second quadrant, the hybrid filter and the filter are disposed in a third quadrant, the power amplifier is disposed closer to a reference point than the power amplifier, the third inductor is disposed closer to the reference point than the fourth inductor, and the hybrid filter is disposed closer to the reference point than the filter.

16 Claims, 4 Drawing Sheets

(52) U.S. Cl.
CPC ............... *H03F 2200/222* (2013.01); *H03F 2200/387* (2013.01); *H03F 2200/451* (2013.01)

(58) Field of Classification Search
CPC ......... H03H 9/6483; H03F 1/56; H03F 3/245; H03F 2200/222; H03F 2200/387; H03F 2200/451; H03F 3/72; H03F 2200/111; H03F 2200/294; H03F 2203/7209; H03F 3/195; H04B 1/38
See application file for complete search history.

(56) References Cited

U.S. PATENT DOCUMENTS

| | | | | |
|---|---|---|---|---|
| 2021/0058069 A1* | 2/2021 | Komatsu | ............... | H03H 9/703 |
| 2021/0091751 A1* | 3/2021 | Komatsu | ................. | H03H 9/72 |
| 2021/0159876 A1* | 5/2021 | Maki | .................... | H03H 9/6443 |
| 2023/0318573 A1* | 10/2023 | Kido | ...................... | H04B 1/38 |
| 2024/0030955 A1* | 1/2024 | Miura | .................... | H04B 1/006 |

FOREIGN PATENT DOCUMENTS

| | | | |
|---|---|---|---|
| JP | 2021-044654 A | 3/2021 |
| JP | 2021-048503 A | 3/2021 |
| JP | 2021-048566 A | 3/2021 |

\* cited by examiner

RADIO-FREQUENCY MODULE AND COMMUNICATION DEVICE

CROSS-REFERENCE TO RELATED APPLICATIONS

This application is a continuation of international application no. PCT/JP2022/010793, filed Mar. 11, 2022, and which claims priority to Japanese application no. 2021-059145, filed Mar. 31, 2021. The entire contents of both prior applications are hereby incorporated by reference.

TECHNICAL FIELD

The present disclosure relates to a radio-frequency module and a communication device.

BACKGROUND ART

Patent Document 1 discloses a hybrid acoustic LC filter including acoustic resonators (acoustic wave resonator elements), an inductor, and a capacitor. According to Patent Document 1, this hybrid acoustic LC filter provides a relatively wide pass band and at the same time achieves a strict out-of-band rejection specification.

CITATION LIST

Patent Document

Patent Document 1: Japanese Unexamined Patent Application Publication No. 2020-14204

SUMMARY

Technical Problems

However, as recognized by the present inventor, because the hybrid acoustic LC filter disclosed in Patent Document 1 is formed by an acoustic wave resonator element-inductor-capacitor combination, the hybrid acoustic LC filter includes many components. When a radio-frequency module for multiple bands has multiple transfer paths each including the hybrid acoustic LC filter, wiring losses in the transfer paths tend to increase in the radio-frequency module. As a result, a problem can arise in which a low-loss signal transfer characteristic is not achieved.

The present disclosure has been made to address the problem described above, and provides a radio-frequency module for multiple bands including hybrid filters and a communication device for multiple bands including hybrid filters with a low-loss signal transfer characteristic.

Solutions to Problems

A radio-frequency module according to an aspect of the present disclosure includes a substrate having a first major surface opposite to a second major surface, a first hybrid filter including a first acoustic wave resonator element, a first inductor, and a first capacitor, the first hybrid filter having a pass band including 5th Generation New Radio (5G-NR) n77, a first filter including a second acoustic wave resonator element and a second inductor, the first filter having a pass band including 5G-NR n79, a first power amplifier and a second power amplifier, a third inductor coupled between the first power amplifier and the first hybrid filter, and a fourth inductor coupled between the second power amplifier and the first filter. The pass band width of the first hybrid filter is wider than the resonance band width of the first acoustic wave resonator element. When the substrate is viewed in plan view, in the case in which (1) a first quadrant that is an upper-left region with respect to a reference point on the substrate, (2) a second quadrant that is a lower-left region with respect to the reference point, (3) a third quadrant that is a lower-right region with respect to the reference point, and (4) a fourth quadrant that is an upper-right region with respect to the reference point are provided, at least a portion of the first power amplifier and at least a portion of the second power amplifier are disposed in the first quadrant; at least a portion of the third inductor and at least a portion of the fourth inductor are disposed in the second quadrant; at least a portion of the first hybrid filter and at least a portion of the first filter are disposed in the third quadrant; the first power amplifier is disposed closer to the reference point than the second power amplifier; the third inductor is disposed closer to the reference point than the fourth inductor; and the first hybrid filter is disposed closer to the reference point than the first filter.

Advantageous Effects

The present disclosure provides a radio-frequency module for multiple bands including hybrid filters and a communication device for multiple bands including hybrid filters with a low-loss signal transfer characteristic.

DETAILED DESCRIPTION

Figure 1:
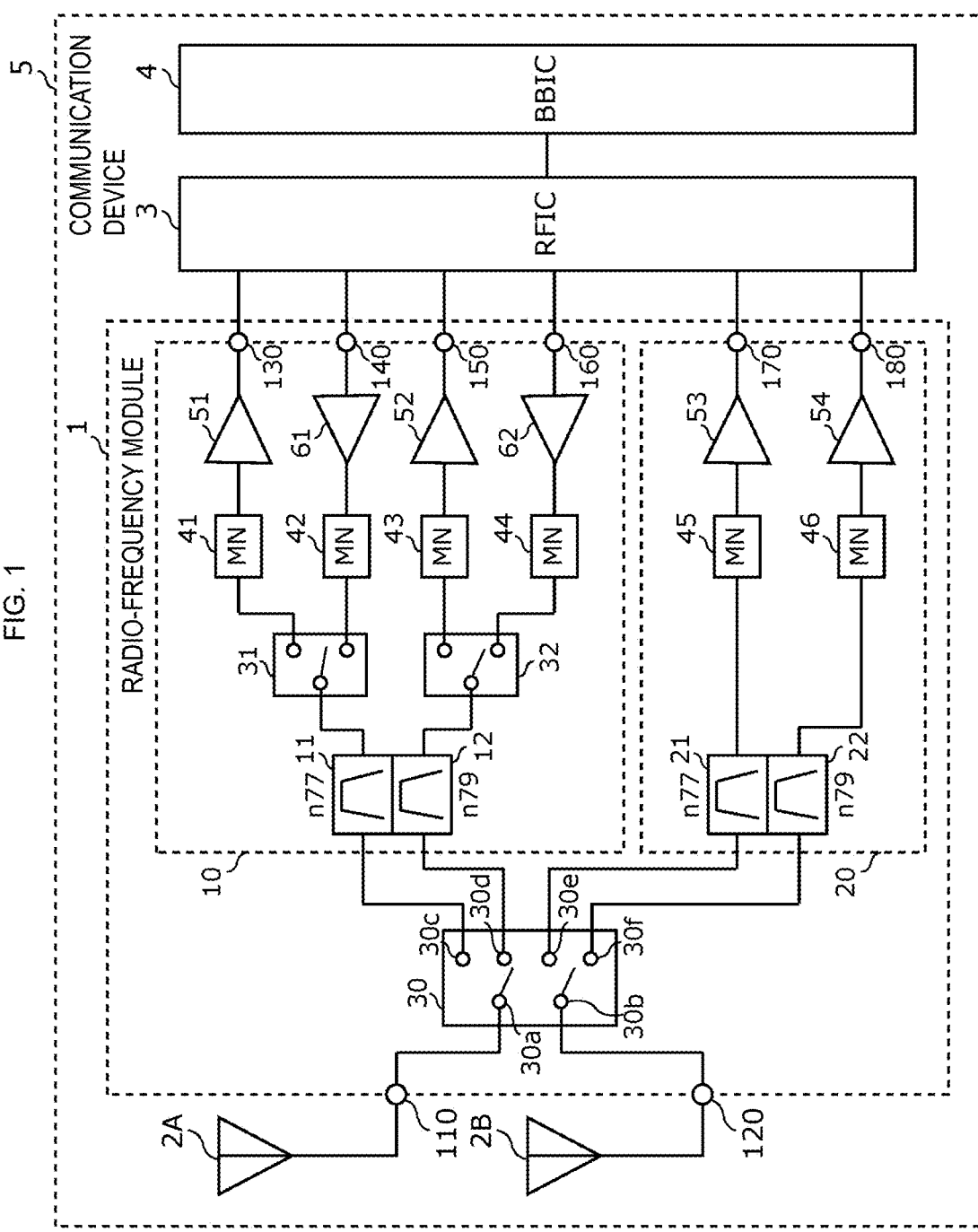
FIG. 1 is a circuit configuration diagram of a radio-frequency module and a communication device according to an exemplary embodiment.

Hereinafter, exemplary embodiments of the present disclosure will be described in detail. The exemplary embodiments described below are all specific or comprehensive examples. Numerical values, shapes, materials, constituent elements, arrangements of constituent elements, and modes of connection, and other specifics given in the following embodiments are merely examples and are not intended to limit the present disclosure. Among the constituent elements in the following practical example and modified example, constituent elements not recited in any of the independent claims are described as arbitrary constituent elements. The sizes or size ratios of the constituent elements illustrated in the drawings are not necessarily exact. Like reference symbols are used to denote substantially like configurations in the drawings, and redundant descriptions thereof may be omitted or simplified.

In the following description, words used to express relationships between elements, such as parallel and vertical, words used to express the shape of an element, such as rectangular, and numerical ranges do not necessarily denote the exact meanings but denote substantially the same meanings involving, for example, several percent differences.

As used herein, the expression "A is disposed at a first major surface of a substrate" means not only that A is mounted directly on the first major surface but also that of the space on the first major surface side and the space on the second major surface side that are separated by the substrate, A is disposed in the space on the first major surface side. Specifically, the expression also means that A is mounted at the first major surface with another circuit element, an electrode, or another element that is interposed therebetween.

In the following description, the term "couple" includes not only the case in which a circuit component is coupled directly to another circuit component by using a connection terminal and/or an interconnection conductor but also the case in which a circuit component is electrically coupled to another circuit component via still another circuit component. The expression "coupled between A and B" means that a circuit element is coupling to both A and B while the circuit element is positioned between A and B.

In the drawings described below, the x axis and the y axis are axes perpendicular to each other in a plane parallel to major surfaces of a module substrate. The z axis is an axis perpendicular to major surfaces of a module substrate; the positive direction of the z axis indicates an upward direction, and the negative direction of the z axis indicates a downward direction.

Regarding the module configuration of the present disclosure, the expression "plan view" denotes that an object orthogonally projected on an xy plane is viewed from the front side in the positive direction of the z axis. The expression "a component is disposed at a major surface of a substrate" includes the case in which the component is positioned in contact with the major surface of the substrate, the case in which the component is positioned over the major surface without contact with the major surface, and the case in which the component is partially embedded in the substrate at the major surface.

In the following description, in the case in which A, B, and C is mounted on the substrate, the expression "when the substrate (or the major surface of the substrate) is viewed in plan view, C is disposed between A and B" means that the region occupied by C is intersected by at least one of the line segments connecting points within A and points within B when the substrate is viewed in plan view. The plan view of a substrate means that the substrate and circuit elements mounted on the substrate are viewed in the state in which the substrate and circuit elements are orthogonally projected on a plane parallel to the major surface of the substrate.

In the following, a "transmit path" refers to a transfer line formed by, for example, an interconnection for transferring radio-frequency transmit signals, an electrode directly coupled to the interconnection, and a terminal directly coupled to the interconnection or electrode. Similarly, a "receive path" refers to a transfer line formed by, for example, an interconnection for transferring radio-frequency receive signals, an electrode directly coupled to the interconnection, and a terminal directly coupled to the interconnection or electrode.

Embodiment

[1. Configuration of Radio-Frequency Module 1 and Communication Device 5 According to Embodiment]

FIG. 1 is a circuit configuration diagram of a radio-frequency module 1 and a communication device 5 according to an exemplary embodiment. As illustrated in the drawing, the communication device 5 includes the radio-frequency module 1, antennas 2A and 2B, a radio-frequency signal processing circuit (RFIC) 3, and a baseband signal processing circuit (BBIC) 4.

The RFIC 3 is a radio-frequency signal processing circuit for processing radio-frequency signals received or to be transmitted by the antennas 2A and 2B. Specifically, the RFIC 3 processes a receive signal inputted through a receive path of the radio-frequency module 1 by for example, downconversion and outputs the receive signal generated by the signal processing to the BBIC 4. The RFIC 3 outputs a radio-frequency transmit signal processed based on a signal inputted from the BBIC 4 to a transmit path of the radio-frequency module 1.

The BBIC 4 is a circuit for performing data processing using signals of frequencies lower than radio-frequency signals transferred in the radio-frequency module 1. The signal processed by the BBIC 4 is used as, for example, an image signal for displaying an image or a sound signal for talk through a speaker.

The RFIC 3 functions as a controller for controlling connections of switches 30, 31, and 32 included in the radio-frequency module 1 based on whether the radio-frequency module 1 is used for transmission or reception and which communication band (frequency range) is used. Specifically, the RFIC 3 controls connections of the switches 30, 31, and 32 included in the radio-frequency module 1 via a control signal. The controller may be external to the RFIC 3; for example, the controller may be provided in the radio-frequency module 1 or the BBIC 4.

The RFIC 3 also functions as a controller for controlling the gain of power amplifiers 61 and 62 included in the radio-frequency module 1 and a supply voltage Vcc and a bias voltage Vbias that are to be supplied to the power amplifiers 61 and 62.

The antenna 2A is coupled to an antenna connection terminal 110 of the radio-frequency module 1. The antenna 2A emits a radio-frequency signal outputted from the radio-frequency module 1. The antenna 2A also receives a radio-frequency signal from outside and outputs the radio-frequency signal to the radio-frequency module 1. The antenna 2B is coupled to an antenna connection terminal 120 of the radio-frequency module 1. The antenna 2B emits a radio-frequency signal outputted from the radio-frequency module 1. The antenna 2B also receives a radio-frequency signal from outside and outputs the radio-frequency signal to the radio-frequency module 1.

In the communication device 5 according to the present embodiment, the antennas 2A and 2B and the BBIC 4 are non-essential constituent elements.

The following describes a detailed configuration of the radio-frequency module 1.

As illustrated in FIG. 1, the radio-frequency module 1 includes the antenna connection terminals 110 and 120, the switch 30, and radio-frequency circuits 10 and 20.

The antenna connection terminal 110 is a first antenna common terminal coupled to the antenna 2A. The antenna connection terminal 120 is a second antenna common terminal coupled to the antenna 2B.

The switch 30 is an example of a third switch. The switch 30 has common terminals 30a and 30b and selection terminals 30c, 30d, 30e, and 30f. In the switch 30, the common terminal 30a is connected to or disconnected from at least one of the selection terminals 30c to 30f, and the common terminal 30b is connected to or disconnected from at least one of the selection terminals 30c to 30f. The common terminal 30a is coupled to the antenna connection terminal 110. The common terminal 30b is coupled to the antenna connection terminal 120. The selection terminal 30c is coupled to a hybrid filter 11. The selection terminal 30d is coupled to a filter 12. The selection terminal 30e is coupled to a hybrid filter 21. The selection terminal 30f is coupled to a filter 22. The switch 30 is operable to control connection and disconnection between the hybrid filter 11 and the antenna connection terminal 110 and connection and disconnection between the hybrid filter 11 and the antenna connection terminal 120. The switch 30 is operable to control connection and disconnection between the filter 12 and the antenna connection terminal 110 and connection and disconnection between the filter 12 and the antenna connection terminal 120. The switch 30 is operable to control connection and disconnection between the hybrid filter 21 and the antenna connection terminal 110 and connection and disconnection between the hybrid filter 21 and the antenna connection terminal 120. The switch 30 is operable to control connection and disconnection between the filter 22 and the antenna connection terminal 110 and connection and disconnection between the filter 22 and the antenna connection terminal 120.

With the connection configuration of the switch 30 described above, the communication device 5 is able to couple the antenna 2A to at least one of the hybrid filters 11 and 21 and the filters 12 and 22 and to couple the antenna 2B to at least one of the hybrid filters 11 and 21 and the filters 12 and 22.

The radio-frequency circuit 10 includes receive output terminals 130 and 150, transmit input terminals 140 and 160, the hybrid filter 11, the filter 12, the switches 31 and 32, matching circuits 41, 42, 43, and 44, low-noise amplifiers 51 and 52, and the power amplifiers 61 and 62.

The hybrid filter 11 is an example of a first hybrid filter. The hybrid filter 11 includes at least one first acoustic wave resonator element, at least one first inductor, and at least one first capacitor. One terminal of the hybrid filter 11 is coupled to the selection terminal 30c. The other terminal of the hybrid filter 11 is coupled to the switch 31. The pass band of the hybrid filter 11 includes 5th Generation New Radio (5G-NR) n77 (a first communication band: 3300-4200 MHz).

The filter 12 is an example of a first filter. The filter 12 includes at least one second acoustic wave resonator element and at least one second inductor. One terminal of the filter 12 is coupled to the selection terminal 30d. The other terminal of the filter 12 is coupled to the switch 32. The pass band of the filter 12 includes 5G-NR n79 (a second communication band: 4400-5000 MHz).

The first acoustic wave resonator element and the second acoustic wave element are, for example, acoustic wave resonator elements using surface acoustic waves (SAWs) or acoustic wave resonator elements using bulk acoustic waves (BAWs).

Figure 2A:
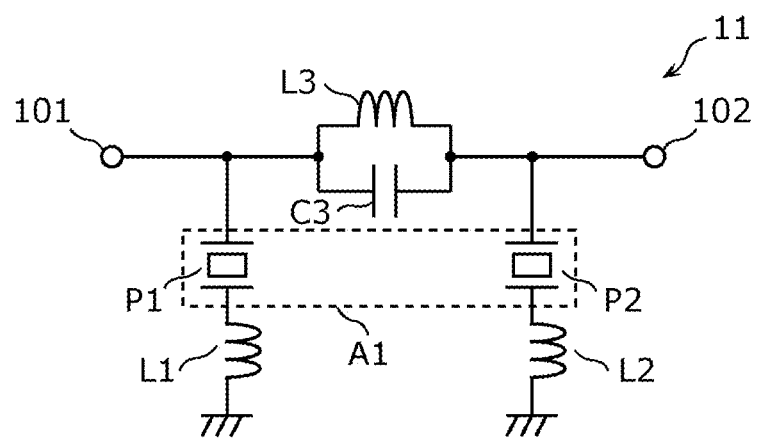
FIG. 2A illustrates an example of a circuit configuration of a first hybrid filter according to the exemplary embodiment.

FIG. 2A illustrates an example of a circuit configuration of the hybrid filter 11 according to the embodiment. As illustrated in the drawing, the hybrid filter 11 includes acoustic wave resonator elements P1 and P2, a capacitor C3, and inductors L1, L2, and L3. Each of the acoustic wave resonator elements P1 and P2 is an example of the first acoustic wave resonator element. Each of the inductors L1, L2, and L3 is an example of the first inductor. The capacitor C3 is an example of the first capacitor.

The inductor L3 and the capacitor C3 form an LC parallel resonant circuit. A series circuit composed of the acoustic wave resonator element P1 and the inductor L1 is provided between the ground and a node in a path connecting an input-output terminal 101 and the LC parallel resonant circuit. A series circuit composed of the acoustic wave resonator element P2 and the inductor L2 is provided between the ground and a node in a path connecting an input-output terminal 102 and the LC parallel resonant circuit. The acoustic wave resonator elements P1 and P2 form an acoustic wave resonator A1, and the acoustic wave resonator elements P1 and P2 are, for example, integrated into one chip. The expression "multiple acoustic wave resonator elements are integrated into one chip" is defined such that multiple acoustic wave resonator elements are formed on one piezoelectric substrate, or multiple acoustic wave resonator elements are included in one package.

In the configuration described above, the pass band and attenuation band of the hybrid filter 11 are determined by controlling the resonant frequency of the LC parallel resonant circuit composed of the inductor L3 and the capacitor C3 and the resonant frequency and anti-resonant frequency of the acoustic wave resonator elements P1 and P2. The LC parallel resonant circuit composed of the inductor L3 and the capacitor C3 determines the pass band of the hybrid filter 11, and the acoustic wave resonator elements P1 and P2 determine attenuation poles.

As a result, the hybrid filter 11, by using an LC circuit, achieves wide pass bands that cannot be achieved with acoustic wave resonator elements, and by using acoustic wave resonator elements, provide steep attenuation slopes that cannot be achieved with an LC circuit.

According to this, the pass band width of the hybrid filter 11 is wider than the resonance band width of the acoustic wave resonator elements P1 and P2.

In the present embodiment, the resonance band width of an acoustic wave resonator element is defined as the difference between the anti-resonant frequency and resonant frequency of the acoustic wave resonator element. A fractional resonance band width is defined as the proportion obtained by dividing the resonance band width by the mean value between the anti-resonant frequency and the resonant frequency. A general SAW or BAW resonator element is known to have a frequency range of 0.1 to 10 GHz and a 3 to 4% fractional resonance band width.

The filter 12 does not necessarily include a capacitor. The pass band width of the filter 12 may be narrower than or equal to the resonance band width of the second acoustic wave resonator element.

Referring back to FIG. 1, the circuit component of the radio-frequency circuit 10 will be described.

The low-noise amplifier 51 is an example of a first low-noise amplifier. The low-noise amplifier 51 is an amplifier for amplifying receive signals in the first communication band with low noise and outputting the receive signals to the receive output terminal 130. The low-noise amplifier 52 is an example of a second low-noise amplifier. The low-noise amplifier 52 is an amplifier for amplifying receive signals in the second communication band with low noise and outputting the receive signals to the receive output terminal 150.

The power amplifier 61 is an example of a first power amplifier. The power amplifier 61 is an amplifier for amplifying transmit signals in the first communication band inputted from the transmit input terminal 140. The power amplifier 62 is an amplifier for amplifying transmit signals in the second communication band inputted from the transmit input terminal 160.

The matching circuit 41 is coupled between the low-noise amplifier 51 and the switch 31. The matching circuit 41 is operable to provide impedance matching between the low-noise amplifier 51 and the switch 31. The matching circuit 42 is coupled between the power amplifier 61 and the switch 31. The matching circuit 42 is operable to provide impedance matching between the power amplifier 61 and the switch 31. The matching circuit 43 is coupled between the low-noise amplifier 52 and the switch 32. The matching circuit 43 is operable to provide impedance matching between the low-noise amplifier 52 and the switch 32. The matching circuit 44 is coupled between the power amplifier 62 and the switch 32. The matching circuit 44 is operable to provide impedance matching between the power amplifier 62 and the switch 32.

The switch 31 is an example of a first switch. The switch 31 has a common terminal and two selection terminals. The common terminal of the switch 31 is coupled to the hybrid filter 11. One selection terminal of the switch 31 is coupled to an input terminal of the low-noise amplifier 51 via the matching circuit 41. The other selection terminal of the switch 31 is coupled to an output terminal of the power amplifier 61 via the matching circuit 42. In other words, the switch 31 is a time division duplex (TDD) switch coupled to the hybrid filter 11, the low-noise amplifier 51, and the power amplifier 61, operable to selectively connect the hybrid filter 11 to the low-noise amplifier 51 or the power amplifier 61. The switch 31 is implemented by, for example, a single-pole double-throw (SPDT) switching circuit.

With the assistance of the switch 31, the hybrid filter 11 functions as a filter for combined use for transmission and reception, coupled to the low-noise amplifier 51 and the power amplifier 61.

The switch 32 is an example of a second switch. The switch 32 has a common terminal and two selection terminals. The common terminal of the switch 32 is coupled to the filter 12. One selection terminal of the switch 32 is coupled to the low-noise amplifier 52 via the matching circuit 43. The other selection terminal of the switch 32 is coupled to the power amplifier 62 via the matching circuit 44. In other words, the switch 32 is a TDD switch operable to selectively connect the filter 12 to the low-noise amplifier 52 or the power amplifier 62. The switch 32 is implemented by, for example, an SPDT switching circuit.

With the assistance of the switch 32, the filter 12 functions as a filter for combined use for transmission and reception, coupled to the low-noise amplifier 52 and the power amplifier 62.

The radio-frequency circuit 20 includes receive output terminals 170 and 180, the hybrid filter 21, the filter 22, matching circuits 45 and 46, and low-noise amplifiers 53 and 54.

The hybrid filter 21 is an example of a second hybrid filter. The hybrid filter 21 includes at least one third acoustic wave resonator element, at least one fifth inductor, and at least one second capacitor. One terminal of the hybrid filter 21 is coupled to the selection terminal 30e. The other terminal of the hybrid filter 21 is coupled to the low-noise amplifier 53 via the matching circuit 45. The hybrid filter 21 is not coupled to any power amplifier. The pass band of the hybrid filter 21 includes 5G-NR n77.

With this configuration, the hybrid filter 21 functions as a filter for dedicated use for reception, coupled between the switch 30 and the low-noise amplifier 53.

The filter 22 is an example of a second filter. The filter 22 includes at least one fourth acoustic wave resonator element and at least one sixth inductor. One terminal of the filter 22 is coupled to the selection terminal 30f. The other terminal of the filter 22 is coupled to the low-noise amplifier 54 via the matching circuit 46. The filter 22 is not coupled to any power amplifier. The pass band of the filter 22 includes 5G-NR n79.

With this configuration, the filter 22 functions as a filter for dedicated use for reception, coupled to the switch 30.

The third acoustic wave resonator element and the fourth acoustic wave element are, for example, acoustic wave resonator elements using SAWs or acoustic wave resonator elements using BAWs.

Figure 2B:
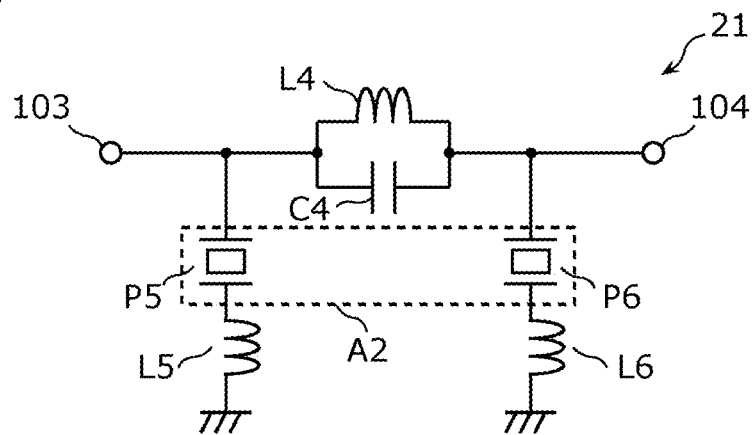
FIG. 2B illustrates an example of a circuit configuration of a second hybrid filter according to the exemplary embodiment.

FIG. 2B illustrates an example of a circuit configuration of the hybrid filter 21 according to the embodiment. As illustrated in the drawing, the hybrid filter 21 includes acoustic wave resonator elements P5 and P6, a capacitor C4, and inductors L4, L5, and L6. Each of the acoustic wave resonator elements P5 and P6 is an example of the second acoustic wave resonator element. Each of the inductors L4, L5, and L6 is an example of the second inductor. The capacitor C4 is an example of the second capacitor.

The inductor L4 and the capacitor C4 form an LC parallel resonant circuit. A series circuit composed of the acoustic wave resonator element P5 and the inductor L5 is provided between the ground and a node in a path connecting an input-output terminal 103 and the LC parallel resonant circuit. A series circuit composed of the acoustic wave resonator element P6 and the inductor L6 is provided between the ground and a node in a path connecting an input-output terminal 104 and the LC parallel resonant circuit. The acoustic wave resonator elements P5 and P6 form an acoustic wave resonator A2, and the acoustic wave resonator elements P5 and P6 are, for example, integrated into one chip.

In the configuration described above, the pass band and attenuation band of the hybrid filter 21 are determined by controlling the resonant frequency of the LC parallel resonant circuit composed of the inductor L4 and the capacitor C4 and the resonant frequency and anti-resonant frequency of the acoustic wave resonator elements P5 and P6. The LC parallel resonant circuit composed of the inductor L4 and the capacitor C4 determines the pass band of the hybrid filter 21, and the acoustic wave resonator elements P5 and P6 determine attenuation poles.

As a result, the hybrid filter 21, by using an LC circuit, achieves wide pass bands that cannot be achieved with acoustic wave resonator elements, and by using acoustic wave resonator elements, provide steep attenuation slopes that cannot be achieved with an LC circuit.

According to this, the pass band width of the hybrid filter 21 is wider than the resonance band width of the acoustic wave resonator elements P5 and P6.

The filter 22 does not necessarily include a capacitor. The pass band width of the filter 22 may be narrower than or equal to the resonance band width of the fourth acoustic wave resonator element.

Referring back to FIG. 1, the circuit component of the radio-frequency circuit 20 will be described.

The low-noise amplifier 53 is an example of a third low-noise amplifier. The low-noise amplifier 53 is an amplifier for amplifying receive signals in the first communication band with low noise and outputting the receive signals to the receive output terminal 170. The low-noise amplifier 54 is an amplifier for amplifying receive signals in the second communication band with low noise and outputting the receive signals to the receive output terminal 180.

The matching circuit 45 is coupled between the low-noise amplifier 53 and the hybrid filter 21. The matching circuit 45 is operable to provide impedance matching between the low-noise amplifier 53 and the hybrid filter 21. The matching circuit 46 is coupled between the low-noise amplifier 54 and the filter 22. The matching circuit 46 is operable to provide impedance matching between the low-noise amplifier 54 and the filter 22.

With the circuit configuration described above, the radio-frequency module 1 is operable to individually transfer a transmit signal in the first communication band, a receive signal in the first communication band, a transmit signal in the second communication band, and a receive signal in the second communication band, or simultaneously transfer at least two selected from a transmit signal in the first communication band, a receive signal in the first communication band, a transmit signal in the second communication band, and a receive signal in the second communication band.

A first transmit path including the power amplifier 61, the matching circuit 42, the switch 31, the hybrid filter 11, and the switch 30 is used to transfer transmit signals in the first communication band (5G-NR n77).

A second transmit path including the power amplifier 62, the matching circuit 44, the switch 32, the filter 12, and the switch 30 is used to transfer transmit signals in the second communication band (5G-NR n79).

A first receive path including the switch 30, the hybrid filter 11, the switch 31, the matching circuit 41, and the low-noise amplifier 51 is used to transfer receive signals in the first communication band (5G-NR n77).

A second receive path including the switch 30, the filter 12, the switch 32, the matching circuit 43, and the low-noise amplifier 52 is used to transfer receive signals in the second communication band (5G-NR n79).

A third receive path including the switch 30, the hybrid filter 21, the matching circuit 45, and the low-noise amplifier 53 is used to transfer receive signals in the first communication band (5G-NR n77).

A fourth receive path including the switch 30, the filter 22, the matching circuit 46, and the low-noise amplifier 54 is used to transfer receive signals in the second communication band (5G-NR n79).

Regarding the radio-frequency module 1, between the first communication band (5G-NR n77) and the second communication band (5G-NR n79), the first communication band (5G-NR n77) is used in wider areas. In other words, between the first communication band (5G-NR n77) and the second communication band (5G-NR n79), the first communication band (5G-NR n77) is used more frequently.

This means that between the first transmit path and the second transmit path, the first transmit path can be used more frequently. Between the first receive path and the second receive path, the first receive path can be used more frequently. Between the third receive path and the fourth receive path, the third receive path can be used more frequently.

At least two or more of the low-noise amplifiers 51, 52, 53, and 54 and the switches 30, 31, and 32 may be integrated into one semiconductor integrated circuit (IC). The semiconductor IC may be implemented by, for example, a CMOS circuit. Specifically, the semiconductor IC is produced by a silicon-on-insulator (SOI) process. In this manner, the semiconductor IC can be manufactured with low costs. The semiconductor IC may be made of at least any of GaAs, SiGe, and GaN. This enables output of radio-frequency signals with high amplification performance and low-noise performance.

The circuit configuration of the hybrid filter 11 according to the present embodiment and the circuit configuration of the hybrid filter 21 according to the present embodiment are not limited to the circuit configuration in FIG. 2A and the circuit configuration in FIG. 2B. It is sufficient that each of the hybrid filters 11 and 21 according to the present embodiment includes one or more acoustic wave resonator elements, one or more inductors, and one or more capacitors; and the pass band width of the hybrid filter is wider than the resonance band width of the acoustic wave resonator element. In the circuit configuration of each of the hybrid filters 11 and 21 according to the present embodiment, no switch is provided between any acoustic wave resonator element and the LC circuit. For example, in the hybrid filter 11, no switch is inserted between the LC parallel resonant circuit composed of the inductor L3 and the capacitor C3 and the acoustic wave resonator element P1 and between the LC parallel resonant circuit and the acoustic wave resonator element P2.

Both of the one terminal of the hybrid filter 11 and the one terminal of the filter 12 may be coupled to one selection terminal of the switch 30. Both of the one terminal of the hybrid filter 21 and the one terminal of the filter 22 may be coupled to one selection terminal of the switch 30.

Filters may be individually coupled between the switch 31 and the low-noise amplifier 51, between the switch 31 and the power amplifier 61, between the switch 32 and the low-noise amplifier 52, and between the switch 32 and the power amplifier 62.

It is sufficient that the radio-frequency module 1 according to the present embodiment include, among the circuit components and circuit elements illustrated in FIG. 1, at least the hybrid filter 11, the filter 12, the power amplifiers 61 and 62, and the matching circuit 42 and 44.

Because the radio-frequency module 1 having the circuit configuration described above includes hybrid filters formed by acoustic wave resonator element-inductor-capacitor combinations, the radio-frequency module 1 includes many components. As a result, wiring losses in transfer paths tend to increase in the radio-frequency module 1.

The following describes a configuration of the radio-frequency module 1 in which wiring losses in transfer paths are reduced.

[2. Arrangement of Circuit Elements of Radio-Frequency Module 1A According to Practical Example]

Figure 3A:
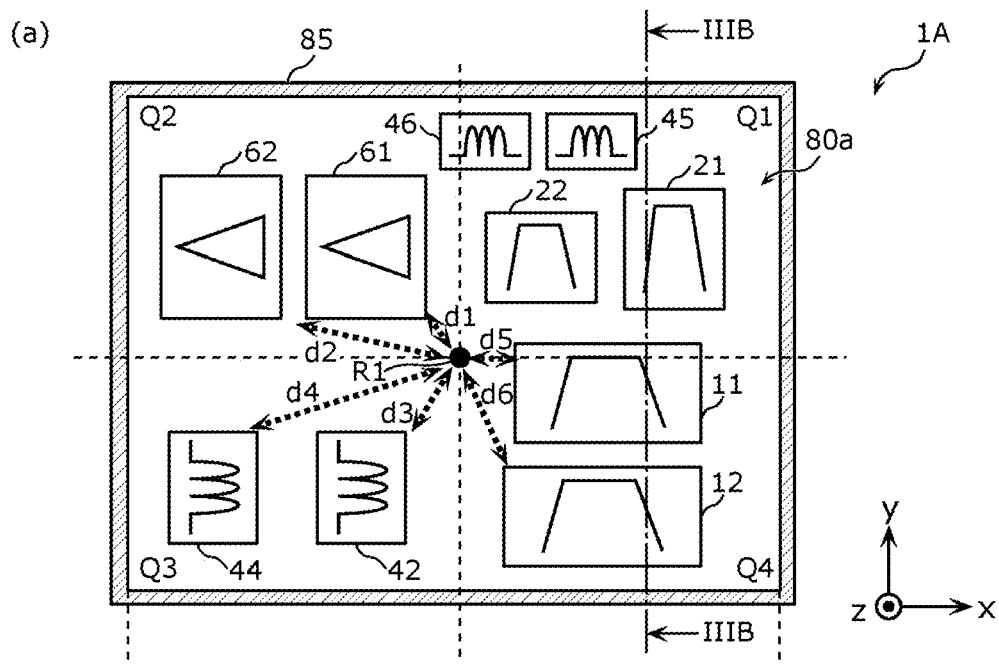
FIG. 3A provides schematic plan views of a configuration of a radio-frequency module according to a practical example.
Figure 3A:
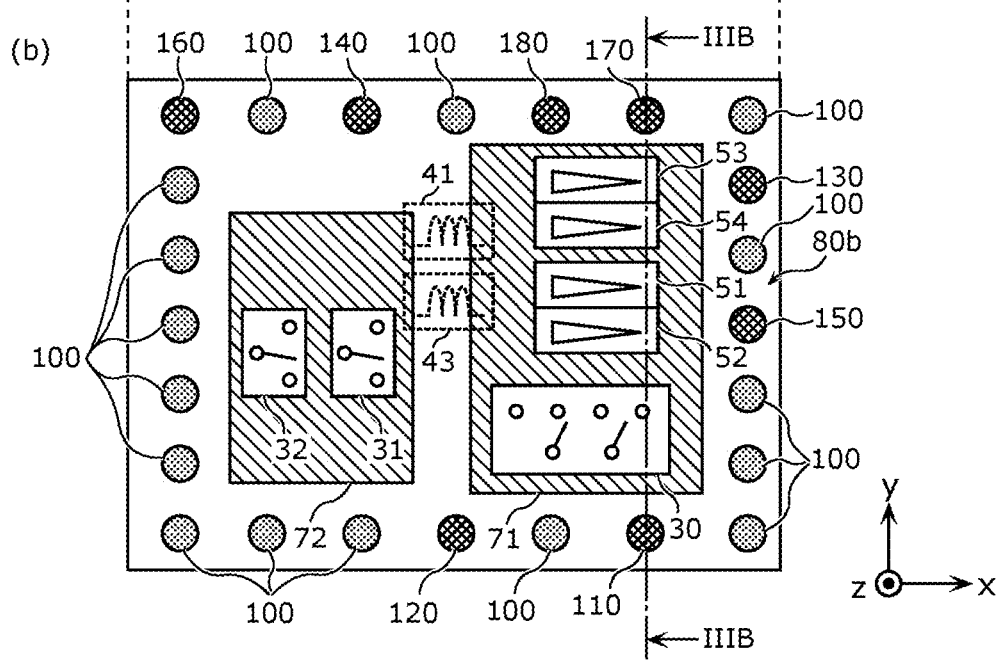
Figure 3B:
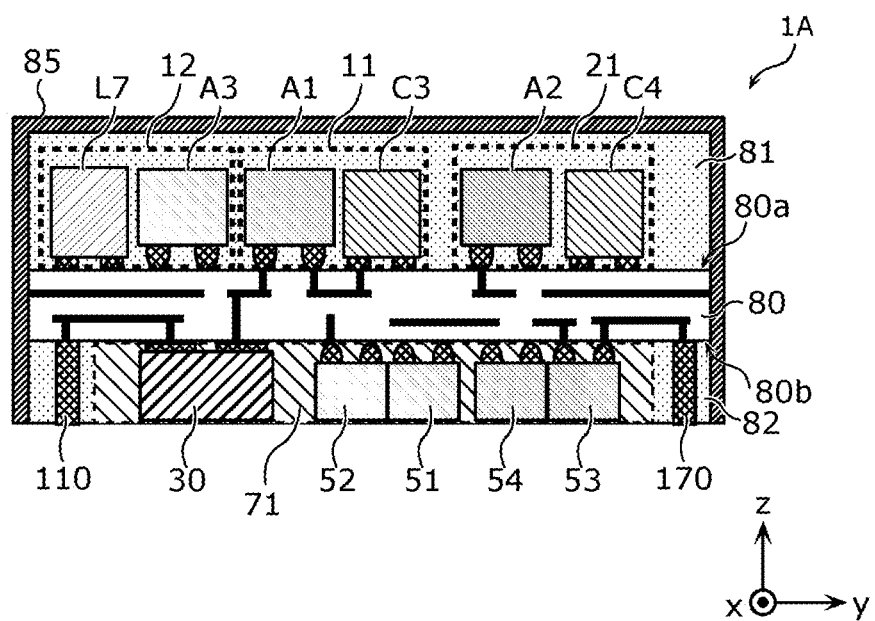
FIG. 3B is a schematic diagram of a sectional configuration of the radio-frequency module according to the practical example.

FIG. 3A provides schematic plan views of a configuration of a radio-frequency module 1A according to a practical example. FIG. 3B is a schematic diagram of a sectional configuration of the radio-frequency module 1A according to the practical example, more specifically, a sectional view taken along line IIIB-IIIB in FIG. 3A. In FIG. 3A, (a) illustrates an arrangement of circuit components when, between major surfaces 80a and 80b of a module substrate 80 that are opposite to each other, the major surface 80a is viewed from the front side in the positive direction of the z axis. In FIG. 3A, (b) provides a cutaway view of the arrangement of circuit components when the major surface 80b is viewed from the front side in the positive direction of the z axis. In FIG. 3A, for ease of understanding of the positional relationship among the circuit components, the individual circuit components are assigned corresponding symbols representing the function of each circuit component, although the symbols are not displayed in the radio-frequency module 1A in actual applications.

The radio-frequency module 1A according to the practical example specifically presents an arrangement of the circuit elements of the radio-frequency module 1 according to the embodiment.

As illustrated in FIGS. 3A and 3B, the radio-frequency module 1A according to the practical example includes, as well as the circuit configuration illustrated in FIG. 1, the module substrate 80, resin members 81 and 82, external connection terminals 100, and a metal shield layer 85.

The module substrate 80 is an example of a substrate. The module substrate 80 has the major surface 80a and the major surface 80b that are opposite to each other. On the module substrate 80, the circuit components constituting the radio-frequency module 1A are mounted. As the module substrate 80, for example, a low temperature co-fired ceramics (LTCC) substrate having a layered structure composed of multiple dielectric layers, a high temperature co-fired ceramics (HTCC) substrate, a component-embedded substrate, a substrate including a redistribution layer (RDL), or a printed-circuit board is used.

In this practical example, the major surface 80a corresponds to a first major surface, and the major surface 80b corresponds to a second major surface.

The module substrate 80 is an example of a substrate. It is desirable that the module substrate 80 have a multilayer structure including a stack of multiple dielectric layers, and a ground electrode pattern be formed in at least one of the dielectric layers. This improves the electromagnetic field blocking capability of the module substrate 80.

As illustrated in (b) of FIG. 3A, the antenna connection terminals 110 and 120, the transmit input terminals 140 and 160, and the receive output terminals 130, 150, 170 and 180 may be formed at the major surface 80b.

The resin member 81 is disposed at the major surface 80a to cover a portion of the circuit components constituting the radio-frequency module 1A and the major surface 80a. The resin member 82 is disposed at the major surface 80b to cover a portion of the circuit components constituting the radio-frequency module 1A and the major surface 80b. The resin members 81 and 82 have the function of maintaining the security of the properties of the circuit components constituting the radio-frequency module 1A such as mechanical strength and moisture resistance.

The metal shield layer 85 covers the surface of the resin member 81. The metal shield layer 85 is set at a ground potential. The metal shield layer 85 is, for example, a metal thin film formed by sputtering.

The resin members 81 and 82 and the metal shield layer 85 are non-essential constituent elements in the radio-frequency module 1 according to the present embodiment.

In this practical example, each of the matching circuits 41 to 46 includes an inductor. The matching circuit 42 includes a third inductor. The matching circuit 44 includes a fourth inductor.

Interconnections connecting the circuit components illustrated in FIG. 1 are formed inside the module substrate 80 and at the major surfaces 80a and 80b. The interconnections may be bonding wires with ends joined to the major surfaces 80a and 80b and any of the circuit components constituting the radio-frequency module 1A, or connectors, electrodes, or wires that are formed on the surface of the circuit components constituting the radio-frequency module 1A.

As illustrated in FIG. 3A, in the radio-frequency module 1A according to the practical example, the hybrid filters 11 and 21, the filters 12 and 22, the power amplifiers 61 and 62, and the matching circuits 42, 44, 45, and 46 are disposed at the major surface 80a. The switches 30, 31, and 32 and the low-noise amplifiers 51, 52, 53, and 54 are disposed at the major surface 80b. The matching circuit 41 and 43 are disposed inside the module substrate 80.

According to the configuration described above, the hybrid filter 11 and the filter 12, the power amplifiers 61 and 62, the low-noise amplifiers 51 to 54, and the switches 30 to 32, which constitute the radio-frequency module 1A, are separately disposed across the module substrate 80 from each other, at both surfaces of the module substrate 80. In this manner, the size of the radio-frequency module 1A is reduced.

It is sufficient that at least one of the circuit components constituting the radio-frequency module 1A be disposed at the major surface 80a, and at least another one of the circuit components be disposed at the major surface 80b. The arrangement illustrated in FIG. 3A should not be interpreted as limiting, and the arrangement does not determine which of the major surfaces 80a and 80b each circuit component should be disposed at. The matching circuit 41 may be disposed at the major surface 80a or the major surface 80b. The matching circuit 43 may be disposed at the major surface 80a or the major surface 80b.

In this practical example, the acoustic wave resonator elements P1 and P2, the capacitor C3, and the inductors L1, L2, and L3, which constitute the hybrid filter 11, are disposed at the major surface 80a. The low-noise amplifiers 51 and 52 are disposed at the major surface 80b. At least one of the acoustic wave resonator elements P1 and P2, the capacitor C3, and the inductors L1, L2, and L3 may be disposed at the major surface 80a, and at least another one of the acoustic wave resonator elements P1 and P2, the capacitor C3, and the inductors L1, L2, and L3 may be disposed inside the module substrate 80 or at the major surface 80b. With this configuration, one or some of the circuit elements of the hybrid filter 11 and the low-noise amplifiers 51 and 52 are separately disposed across the module substrate 80 from each other at both surfaces of the module substrate 80, and as a result, the size of the radio-frequency module 1A is reduced.

At least one of the acoustic wave resonator A3 (the second acoustic wave resonator element) and the inductor L7 (the second inductor), which constitute the filter 12, may be disposed at the major surface 80a, and at least another one of the acoustic wave resonator A3 and the inductor L7 may be disposed inside the module substrate 80 or at the major surface 80b.

As illustrated in (a) of FIG. 3A, in the radio-frequency module 1A according to the practical example, when the module substrate 80 is viewed in plan view, the following quadrants are provided: (1) a first quadrant Q2 that is an upper-left region with respect to a reference point R1 on the module substrate 80, (2) a second quadrant Q3 that is a lower-left region with respect to the reference point R1, (3) a third quadrant Q4 that is a lower-right region with respect to the reference point R1, and (4) a fourth quadrant Q1 that is an upper-right region with respect to the reference point R1. In this case, at least a portion of the power amplifier 61 and at least a portion of the power amplifier 62 are disposed in the first quadrant Q2, and at least a portion of the third inductor included in the matching circuit 42 and at least a portion of the fourth inductor included in the matching circuit 44 are disposed in the second quadrant Q3. At least a portion of the hybrid filter 11 and at least a portion of the filter 12 are disposed in the third quadrant Q4. A distance d1 between the power amplifier 61 and the reference point R1 is smaller than a distance d2 between the power amplifier 62 and the reference point R1. A distance d3 between the third inductor and the reference point R1 is smaller than a distance d4 between the fourth inductor and the reference point R1. A distance d5 between the hybrid filter 11 and the reference point R1 is smaller than a distance d6 between the filter 12 and the reference point R1. In other words, the power amplifier 61 is disposed closer to the reference point R1 than the power amplifier 62, the third inductor is disposed closer to the reference point R1 than the fourth inductor, and the hybrid filter 11 is disposed closer to the reference point R1 than the filter 12.

The reference point R1 on the module substrate 80 is defined as a point of the module substrate 80, not included in the outer edges of the module substrate 80 when the module substrate 80 is viewed in plan view. In other words, when the module substrate 80 is viewed in plan view, the reference point R1 is positioned on the module substrate 80 such that the first quadrant Q2, the second quadrant Q3, the third quadrant Q4, and the fourth quadrant Q1 are provided on the module substrate 80.

With this configuration, the power amplifier 61, the matching circuit 42, and the hybrid filter 11, which are provided in the first transmit path, are respectively disposed in the first quadrant Q2, the second quadrant Q3 and the third quadrant Q4. As such, when the module substrate 80 is viewed in plan view from the front side in the positive direction of the Z axis, the first transmit path is formed as a relatively short path circled around the reference point R1 in the counterclockwise direction. Similarly, the power amplifier 62, the matching circuit 44, and the filter 12, which are provided in the second transmit path, are respectively disposed in the first quadrant Q2, the second quadrant Q3 and the third quadrant Q4. As such, when the module substrate 80 is viewed in plan view from the front side in the positive direction of the Z axis, the second transmit path is formed as a relatively short path circled around the reference point R1 in the counterclockwise direction. As a result, the first transmit path and the second transmit path for transmitting high-power transmit signals are made relatively short. It is thus possible to implement the radio-frequency module 1A for multiple bands having a low-loss signal transfer characteristic. Also, power consumption by the radio-frequency module 1A is reduced.

The power amplifier 61 is disposed closer to the reference point R1 than the power amplifier 62, the third inductor is disposed closer to the reference point R1 than the fourth inductor, and the hybrid filter 11 is disposed closer to the reference point R1 than the filter 12. This arrangement makes the first transmit path shorter than the second transmit path.

With this configuration, it is possible to transfer transmit signals in the first communication band (5G-NR n77), which is used in wider areas and used more frequently, in a low-loss manner. As such, the radio-frequency module 1A for multiple bands highly efficiently achieves low-loss operation.

In this practical example, at least a portion of the hybrid filter 21 and at least a portion of the filter 22 may be disposed in a region other than the fourth quadrant Q1. With this configuration, it is possible to arrange with high density the circuit components constituting the radio-frequency module 1A in a well-balanced manner.

In the radio-frequency module 1A according to the practical example, the external connection terminals 100 are disposed at the major surface 80b. The radio-frequency module 1A exchanges electrical signals with an external substrate provided on the front side in the negative direction of the z axis with respect to the radio-frequency module 1A, through the external connection terminals 100. Some of the external connection terminals 100 may be, as illustrated in (b) of FIG. 3A, the antenna connection terminals 110 and 120, the transmit input terminals 140 and 160, and the receive output terminals 130, 150, 170 and 180. Others of the external connection terminals 100 are set at the ground potential of the external substrate.

The external connection terminals 100 may be columnar electrodes extending in the Z-axis direction through the resin member 82 as illustrated in FIGS. 3A and 3B. Alternatively, the external connection terminals 100 may be bump electrodes formed on the major surface 80b. In this case, the resin member 82 on the major surface 80b is not necessarily provided.

The power amplifiers 61 and 62, the third inductor, and the fourth inductor, which cannot all be easily formed as low-profile structures, are disposed at the major surface 80a. With this configuration, the major surface 80b does not have any circuit component that cannot be easily formed as a low-profile structure, and the height of the major surface 80b side of the radio-frequency module 1A is thus easily reduced.

Between the major surfaces 80a and 80b, the major surface 80b facing the external substrate has the low-noise amplifiers 51 to 54 and the switches 30 to 32, which can be easily formed as low-profile structures. With this configuration, the major surface 80b has circuit components that can be easily formed as low-profile structures, and the height of the major surface 80b side of the radio-frequency module 1A is thus easily reduced. This means that the height of the radio-frequency module 1A is reducible.

The low-noise amplifiers 51 to 54 and the switch 30 are included in a semiconductor IC 71. With this configuration, it is possible to reduce the size and height of the low-noise amplifiers 51 to 54 and the switch 30.

The switches 31 and 32 are included in a semiconductor IC 72. With this configuration, it is possible to reduce the size and height of the switches 31 and 32.

Because the semiconductor ICs 71 and 72 are disposed at the major surface 80b, it is possible to reduce the height of the radio-frequency module 1A.

As illustrated in FIGS. 3A and 3B, when the module substrate 80 is viewed in plan view, the hybrid filter 11 and the switch 30 at least partially overlap.

With this configuration, the hybrid filter 11 and the switch 30, through which both transmit signals and receive signals pass, are coupled to each other mainly by a via interconnect formed inside the module substrate 80 in the vertical direction of the module substrate 80. As such, the interconnection connecting the hybrid filter 11 and the switch 30 is relatively short. This configuration reduces transfer loss of transmit signals and receive signals in the first communication band.

The acoustic wave resonator elements P5 and P6, the capacitor C4, and the inductors L4, L5, and L6, which constitute the hybrid filter 21, are disposed at the major surface 80a. The low-noise amplifier 53 coupled to the hybrid filter 21 via the matching circuit 45 is disposed at the major surface 80b.

As illustrated in FIGS. 3A and 3B, when the module substrate 80 is viewed in plan view, the hybrid filter 21 and the low-noise amplifier 53 at least partially overlap.

With this configuration, the hybrid filter 21 and the low-noise amplifier 53 are coupled to each other mainly by a via interconnect formed inside the module substrate 80 in the vertical direction of the module substrate 80. As such, the interconnection connecting the hybrid filter 21 and the low-noise amplifier 53 is relatively short. This configuration reduces transfer loss of receive signals in the first communication band.

[3. Arrangement of Circuit Elements of Radio-Frequency Module 1B According to Modified Example]

FIG. 3 is a schematic diagram of a sectional configuration of a radio-frequency module 1B according to a modified example. The radio-frequency module 1B according to the modified example specifically presents an arrangement of the circuit elements of the radio-frequency module 1 according to the embodiment.

Figure 3C:
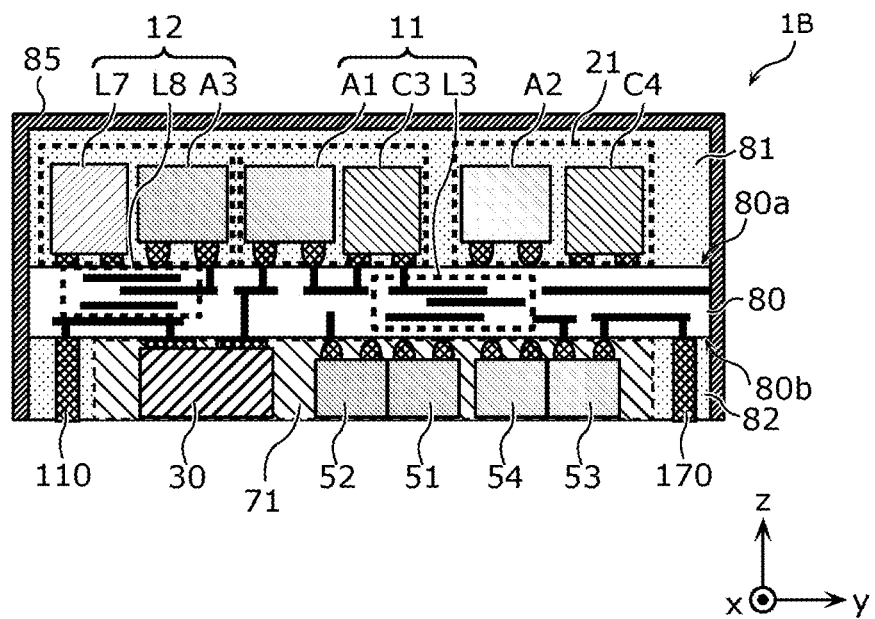
FIG. 3C is a schematic diagram of a sectional configuration of a radio-frequency module according to a modified example.

The radio-frequency module 1B illustrated in FIG. 3C differs from the radio-frequency module 1A according to the practical example in the arrangement of the circuit elements constituting the hybrid filter 11 and the filter 12. The following describes the radio-frequency module 1B according to this modified example with a main focus on configurations different from the radio-frequency module 1A according to the practical example, and descriptions of the same configurations as the radio-frequency module 1A according to the first practical example are not repeated.

The hybrid filter 11 includes the acoustic wave resonator A1 (the acoustic wave resonator elements P1 and P2), the capacitor C3, and the inductors L1, L2, and L3.

The filter 12 includes the acoustic wave resonator A3 and the inductors L7 and L8.

Of the hybrid filter 11, the acoustic wave resonator A1 and the capacitor C3 are disposed at the major surface 80a, and the inductor L3 is formed inside the module substrate 80. The inductor L3 is formed by, for example, multiple planar coil conductors and via-conductors connecting the planar coil conductors.

Of the filter 12, the acoustic wave resonator A3 and the inductor L7 are disposed at the major surface 80a, and the inductor L8 is formed inside the module substrate 80. The inductor L8 is formed by, for example, multiple planar coil conductors and via-conductors connecting the planar coil conductors.

According to the configuration described above, some of the circuit elements constituting the hybrid filter 11 are disposed at the major surface 80a, while the other of the circuit elements are formed inside the module substrate 80. As a result, it is possible to reduce the size of the radio-frequency module 1B.

The circuit element formed inside the module substrate 80 may be an acoustic wave resonator or capacitor.

[4. Effects]

As described above, the radio-frequency module 1A according to the practical example includes the module substrate 80 having the major surfaces 80a and 80b that are opposite to each other, the hybrid filter 11 including the first acoustic wave resonator element, the first inductor, and the first capacitor, having a pass band including 5G-NR n77, the filter 12 including the second acoustic wave resonator element and the second inductor, having a pass band including 5G-NR n79, the power amplifiers 61 and 62, the third inductor coupled between the power amplifier 61 and the hybrid filter 11, and the fourth inductor coupled between the power amplifier 62 and the filter 12. The pass band width of the hybrid filter 11 is wider than the resonance band width of the first acoustic wave resonator element. When the module substrate 80 is viewed in plan view, in the case in which (1) a first quadrant Q2 that is an upper-left region with respect to a reference point R1 on the module substrate 80, (2) a second quadrant Q3 that is a lower-left region with respect to the reference point R1, (3) a third quadrant Q4 that is a lower-right region with respect to the reference point R1, and (4) a fourth quadrant Q1 that is an upper-right region with respect to the reference point R1 are provided, at least a portion of the power amplifier 61 and at least a portion of the power amplifier 62 are disposed in the first quadrant Q2; at least a portion of the third inductor and at least a portion of the fourth inductor are disposed in the second quadrant Q3; at least a portion of the hybrid filter 11 and at least a portion of the filter 12 are disposed in the third quadrant Q4; the power amplifier 61 is disposed closer to the reference point R1 than the power amplifier 62; the third inductor is disposed closer to the reference point R1 than the fourth inductor; and the hybrid filter 11 is disposed closer to the reference point R1 than the filter 12.

With this configuration, the power amplifier 61, the third inductor, and the hybrid filter 11, which are provided in the first transmit path, are respectively disposed in the first quadrant Q2, the second quadrant Q3 and the third quadrant Q4. As such, when the module substrate 80 is viewed in plan view from the front side in the positive direction of the Z axis, the first transmit path is formed as a relatively short path circled around the reference point R1 in the counter-clockwise direction. Similarly, the power amplifier 62, the fourth inductor, and the filter 12, which are provided in the second transmit path, are respectively disposed in the first quadrant Q2, the second quadrant Q3 and the third quadrant Q4. As such, when the module substrate 80 is viewed in plan view from the front side in the positive direction of the Z axis, the second transmit path is formed as a relatively short path circled around the reference point R1 in the counter-clockwise direction. As a result, the first transmit path and the second transmit path for transmitting high-power transmit signals are made relatively short. It is thus possible to implement the radio-frequency module 1A for multiple bands having a low-loss signal transfer characteristic. Also, power consumption by the radio-frequency module 1A is reduced.

The power amplifier 61 is disposed closer to the reference point R1 than the power amplifier 62, the third inductor is disposed closer to the reference point R1 than the fourth inductor, and the hybrid filter 11 is disposed closer to the reference point R1 than the filter 12. This arrangement makes the first transmit path shorter than the second transmit path. With this configuration, it is possible to transfer transmit signals in the first communication band (5G-NR n77), which is used in wider areas and used more frequently, in a low-loss manner. As such, the radio-frequency module 1A for multiple bands highly efficiently achieves low-loss operation.

The radio-frequency module 1A according to the practical example may further include the low-noise amplifiers 51 and 52 disposed at the major surface 80b, the switch 31 coupled to the hybrid filter 11, the low-noise amplifier 51, and the third inductor, configured to selectively connect the hybrid filter 11 to the low-noise amplifier 51 or the third inductor, and the switch 32 coupled to the filter 12, the low-noise amplifier 52, and the fourth inductor, configured to selectively connect the filter 12 to the low-noise amplifier 52 or the fourth inductor. One of the first acoustic wave resonator element, the first inductor, and the first capacitor may be disposed at the major surface 80a.

With this configuration, one or some of the circuit elements of the hybrid filter 11 and the low-noise amplifiers 51 and 52 are separately disposed across the module substrate 80 from each other at both surfaces of the module substrate 80, and as a result, the size of the radio-frequency module 1A is reduced.

In the radio-frequency module 1A according to the practical example and the radio-frequency module 1B according to the modified example, the first acoustic wave resonator element, the first inductor, and the first capacitor may be disposed at the major surface 80a or inside the module substrate 80. The second acoustic wave resonator element and the second inductor may be disposed at the major surface 80a or inside the module substrate 80.

With this configuration, one or some of the circuit elements constituting the hybrid filter 11 and one or some of the circuit elements constituting the filter 12 are disposed at the major surface 80a or inside the module substrate 80, and as a result, the size of the radio-frequency modules 1A and 1B is reduced.

The radio-frequency module 1A according to the practical example may further include the external connection terminals 100 disposed at the major surface 80b. The power amplifiers 61 and 62 may be disposed at the major surface 80a. The third inductor and the fourth inductor may be disposed at the major surface 80a.

The power amplifiers 61 and 62, the third inductor, and the fourth inductor, which cannot all be easily formed as low-profile structures, are disposed at the major surface 80a. Because the major surface 80b does not have any circuit component that cannot be easily formed as a low-profile structure, the height of the major surface 80b side of the radio-frequency module 1A is easily reduced.

The radio-frequency module 1A according to the practical example may further include the switch 30 coupled to the hybrid filter 11 and the filter 12, configured to control connection and disconnection between the hybrid filter 11 and the antenna connection terminals 110 and 120 and connection and disconnection between the filter 12 and the antenna connection terminals 110 and 120. When the module substrate 80 is viewed in plan view, the hybrid filter 11 and the switch 30 may at least partially overlap.

With this configuration, the hybrid filter 11 and the switch 30, through which both transmit signals and receive signals pass, are coupled to each other mainly by a via interconnect formed inside the module substrate 80 in the vertical direction of the module substrate 80. As such, the interconnection connecting the hybrid filter 11 and the switch 30 is relatively short. This configuration reduces transfer loss of transmit signals and receive signals in the first communication band.

In the radio-frequency module 1A according to the practical example, the low-noise amplifiers 51 and 52 and the switch 30 may be included in the semiconductor IC 71 disposed at the major surface 80b.

With this configuration, it is possible to reduce the size and height of the low-noise amplifiers 51 and 52 and the size and height of the switch 30. Because the semiconductor IC 71 is disposed at the major surface 80b, it is possible to reduce the height of the radio-frequency module 1A.

The radio-frequency module 1A according to the practical example may further include the hybrid filter 21 including the third acoustic wave resonator element, the fifth inductor, and the second capacitor, having a pass band including 5G-NR n77, and the filter 22 including the fourth acoustic wave resonator element and the sixth inductor, having a pass band including 5G-NR n79. The hybrid filter 21 and the filter 22 may be filters for dedicated use for reception coupled to the switch 30. At least a portion of the hybrid filter 21 and at least a portion of the filter 22 may be disposed in the fourth quadrant Q1.

With this configuration, it is possible to arrange with high density the circuit components constituting the radio-frequency module 1A in a well-balanced manner.

The radio-frequency module 1A according to the practical example may further include the low-noise amplifier 53 coupled to the hybrid filter 21. When the module substrate 80 is viewed in plan view, the hybrid filter 21 and the low-noise amplifier 53 may at least partially overlap.

With this configuration, the hybrid filter 21 and the low-noise amplifier 53 are coupled to each other mainly by a via interconnect formed inside the module substrate 80 in the vertical direction of the module substrate 80. As such, the interconnection connecting the hybrid filter 21 and the low-noise amplifier 53 is relatively short. This configuration reduces transfer loss of receive signals in the first communication band.

The communication device 5 includes the RFIC 3 for processing radio-frequency signals received by the antennas 2A and 2B and the radio-frequency module 1 for transferring the radio-frequency signals between the antennas 2A and 2B and the RFIC 3.

With this configuration, it is possible to provide the communication device 5 for multiple bands including the hybrid filter 11 with a low-loss signal transfer characteristic.

Other Embodiments

The radio-frequency module and communication device according to the present disclosure has been described by using the exemplary embodiments, practical example, and modified example, but the present disclosure is not limited to the exemplary embodiments, practical example, and modified example described above. The present disclosure also embraces other embodiments implemented as any combination of the constituent elements of the embodiment, practical example, and modified example, other modified examples obtained by making various modifications to the embodiment that occur to those skilled in the art without departing from the scope of the present disclosure, and various hardware devices including the radio-frequency module or communication device according to the present disclosure.

For example, in the radio-frequency module and communication device according to the embodiment, practical example, and modified example, a matching element such as an inductor or capacitor and a switching circuit may be coupled among the constituent elements. The inductor may include a wire inductor formed by a wire serving as an interconnection between constituent elements.

INDUSTRIAL APPLICABILITY

The present disclosure can provide a radio-frequency module or communication device operable in multiband systems, in a wide variety of communication devices such as mobile phones.

The invention claimed is:

1. A radio-frequency module comprising:
   a substrate having a first major surface opposite to a second major surface;
   a first hybrid filter including a first acoustic wave resonator, a first inductor, and a first capacitor, the first hybrid filter having a pass band including 5th Generation New Radio (5G-NR) n77;
   a first filter including a second acoustic wave resonator and a second inductor, the first filter having a pass band including 5G-NR n79;
   a first power amplifier and a second power amplifier;
   a third inductor coupled between the first power amplifier and the first hybrid filter; and a fourth inductor coupled between the second power amplifier and the first filter, wherein a pass band width of the first hybrid filter is wider than a resonance band width of the first acoustic wave resonator, when the substrate is viewed in plan view, in a case in which (1) a first quadrant that is an upper-left region with respect to a reference point on the substrate, (2) a second quadrant that is a lower-left region with respect to the reference point, (3) a third quadrant that is a lower-right region with respect to the reference point, and (4) a fourth quadrant that is an upper-right region with respect to the reference point are provided, at least a portion of the first power amplifier and at least a portion of the second power amplifier are disposed in the first quadrant, at least a portion of the third inductor and at least a portion of the fourth inductor are disposed in the second quadrant, at least a portion of the first hybrid filter and at least a portion of the first filter are disposed in the third quadrant, the first power amplifier is disposed closer to the reference point than the second power amplifier, the third inductor is disposed closer to the reference point than the fourth inductor, and the first hybrid filter is disposed closer to the reference point than the first filter.

2. The radio-frequency module according to claim 1, further comprising:

a first low-noise amplifier disposed at the second major surface and a second low-noise amplifier disposed at the second major surface;

a first switch coupled to the first hybrid filter, the first low-noise amplifier, and the third inductor, the first switch being configured to selectively connect the first hybrid filter to the first low-noise amplifier or the third inductor; and a second switch coupled to the first filter, the second low-noise amplifier, and the fourth inductor, the second switch being configured to selectively connect the first filter to the second low-noise amplifier or the fourth inductor, wherein one of the first acoustic wave resonator element, the first inductor, and the first capacitor is disposed at the first major surface.

3. The radio-frequency module according to claim 2, wherein the first acoustic wave resonator element, the first inductor, and the first capacitor are disposed at the first major surface or inside the substrate, and the second acoustic wave resonator element and the second inductor are disposed at the first major surface or inside the substrate.

4. The radio-frequency module according to claim 2, further comprising:

an external connection terminal disposed at the second major surface, wherein the first power amplifier and the second power amplifier are disposed at the first major surface, and the third inductor and the fourth inductor are disposed at the first major surface.

5. The radio-frequency module according to claim 2, further comprising:

a third switch coupled to the first hybrid filter and the first filter, the third switch being configured to control connection and disconnection between the first hybrid filter and an antenna connection terminal and connection and disconnection between the first filter and the antenna connection terminal, wherein when the substrate is viewed in plan view, the first hybrid filter and the third switch at least partially overlap.

6. The radio-frequency module according to claim 5, wherein the first low-noise amplifier, the second low-noise amplifier, and the third switch are included in a semiconductor integrated circuit (IC) disposed at the second major surface.

7. The radio-frequency module according to claim 5, further comprising:

a second hybrid filter including a third acoustic wave resonator, a fifth inductor, and a second capacitor, the second hybrid filter having a pass band including 5G-NR n77; and a second filter including a fourth acoustic wave resonator and a sixth inductor, the second filter having a pass band including 5G-NR n79, wherein the second hybrid filter and the second filter are filters for dedicated use for reception coupled to the third switch, and at least a portion of the second hybrid filter and at least a portion of the second filter are disposed in the fourth quadrant.

8. The radio-frequency module according to claim 7, further comprising:

a third low-noise amplifier coupled to the second hybrid filter, wherein when the substrate is viewed in plan view, the second hybrid filter and the third low-noise amplifier at least partially overlap.

9. A communication device, comprising:

a radio-frequency (RF) signal processing circuit configured to process a radio-frequency signal received by an antenna; and a radio-frequency module being configured to transfer the radio-frequency signal between the antenna and the RF signal processing circuit, the radio frequency antenna module including a substrate having a first major surface opposite to a second major surface;

a first hybrid filter including a first acoustic wave resonator, a first inductor, and a first capacitor, the first hybrid filter having a pass band including 5th Generation New Radio (5G-NR) n77;

a first filter including a second acoustic wave resonator and a second inductor, the first filter having a pass band including 5G-NR n79;

a first power amplifier and a second power amplifier;

a third inductor coupled between the first power amplifier and the first hybrid filter; and a fourth inductor coupled between the second power amplifier and the first filter, wherein a pass band width of the first hybrid filter is wider than a resonance band width of the first acoustic wave resonator, when the substrate is viewed in plan view, in a case in which (1) a first quadrant that is an upper-left region with respect to a reference point on the substrate, (2) a second quadrant that is a lower-left region with respect to the reference point, (3) a third quadrant that is a lower-right region with respect to the reference point, and (4) a fourth quadrant that is an upper-right region with respect to the reference point are provided, at least a portion of the first power amplifier and at least a portion of the second power amplifier are disposed in the first quadrant, at least a portion of the third inductor and at least a portion of the fourth inductor are disposed in the second quadrant, at least a portion of the first hybrid filter and at least a portion of the first filter are disposed in the third quadrant, the first power amplifier is disposed closer to the reference point than the second power amplifier, the third inductor is disposed closer to the reference point than the fourth inductor, and the first hybrid filter is disposed closer to the reference point than the first filter.

10. The communication device of claim 9, further comprising:

a first low-noise amplifier disposed at the second major surface and a second low-noise amplifier disposed at the second major surface;

a first switch coupled to the first hybrid filter, the first low-noise amplifier, and the third inductor, the first switch being configured to selectively connect the first hybrid filter to the first low-noise amplifier or the third inductor; and a second switch coupled to the first filter, the second low-noise amplifier, and the fourth inductor, the second switch being configured to selectively connect the first filter to the second low-noise amplifier or the fourth inductor, wherein one of the first acoustic wave resonator element, the first inductor, and the first capacitor is disposed at the first major surface.

11. The communication device of claim 10, wherein the first acoustic wave resonator element, the first inductor, and the first capacitor are disposed at the first major surface or inside the substrate, and the second acoustic wave resonator element and the second inductor are disposed at the first major surface or inside the substrate.

12. The communication device of claim 10, further comprising:

an external connection terminal disposed at the second major surface, wherein the first power amplifier and the second power amplifier are disposed at the first major surface, and the third inductor and the fourth inductor are disposed at the first major surface.

13. The communication device of claim 10, further comprising:

a third switch coupled to the first hybrid filter and the first filter, the third switch being configured to control connection and disconnection between the first hybrid filter and an antenna connection terminal and connection and disconnection between the first filter and the antenna connection terminal, wherein when the substrate is viewed in plan view, the first hybrid filter and the third switch at least partially overlap.

14. The communication device of claim 13, wherein the first low-noise amplifier, the second low-noise amplifier, and the third switch are included in a semiconductor integrated circuit (IC) disposed at the second major surface.

15. The communication device of claim 13, further comprising:

a second hybrid filter including a third acoustic wave resonator, a fifth inductor, and a second capacitor, the second hybrid filter having a pass band including 5G-NR n77; and a second filter including a fourth acoustic wave resonator and a sixth inductor, the second filter having a pass band including 5G-NR n79, wherein the second hybrid filter and the second filter are filters for dedicated use for reception coupled to the third switch, and at least a portion of the second hybrid filter and at least a portion of the second filter are disposed in the fourth quadrant.

16. The communication device of claim 15, further comprising:

a third low-noise amplifier coupled to the second hybrid filter, wherein when the substrate is viewed in plan view, the second hybrid filter and the third low-noise amplifier at least partially overlap.

* * * * *